(12) United States Patent
Fu et al.

(10) Patent No.: US 8,022,747 B2
(45) Date of Patent: Sep. 20, 2011

(54) SYSTEM FOR SUBSTRATE POTENTIAL REGULATION DURING POWER-UP IN INTEGRATED CIRCUITS

(76) Inventors: Robert Fu, Cupertino, CA (US); Tien-Min Chen, San Jose, CA (US)

( * ) Notice: Subject to any disclaimer, the term of this patent is extended or adjusted under 35 U.S.C. 154(b) by 106 days.

(21) Appl. No.: 12/628,010

(22) Filed: Nov. 30, 2009

(65) Prior Publication Data

US 2010/0073075 A1 Mar. 25, 2010

Related U.S. Application Data

(62) Division of application No. 10/712,523, filed on Nov. 12, 2003, now Pat. No. 7,642,835.

(51) Int. Cl.
*H03K 3/011* (2006.01)
(52) U.S. Cl. .......... 327/534; 327/535; 327/536
(58) Field of Classification Search .......... 327/534, 327/535, 536
See application file for complete search history.

(56) References Cited

U.S. PATENT DOCUMENTS

| | | | |
|---|---|---|---|
| 4,670,861 A * | 6/1987 | Shu et al. ........... | 365/181 |
| 4,798,974 A | 1/1989 | Reczek et al. | |
| 5,086,501 A | 2/1992 | DeLuca et al. | |
| 5,167,024 A | 11/1992 | Smith et al. | |
| 5,201,059 A | 4/1993 | Nguyen | |
| 5,204,863 A | 4/1993 | Saint-Joigny et al. | |
| 5,218,704 A | 6/1993 | Watts, Jr. et al. | |
| 5,230,055 A | 7/1993 | Katz et al. | |
| 5,239,652 A | 8/1993 | Seibert et al. | |
| 5,386,135 A | 1/1995 | Nakazato et al. | |
| 5,422,591 A | 6/1995 | Rastegar et al. | |
| 5,422,806 A | 6/1995 | Chen et al. | |
| 5,440,520 A | 8/1995 | Schutz et al. | |
| 5,461,266 A | 10/1995 | Koreeda et al. | |
| 5,502,838 A | 3/1996 | Kikinis | |
| 5,511,203 A | 4/1996 | Wisor et al. | |
| 5,519,309 A | 5/1996 | Smith | |
| 5,560,020 A | 9/1996 | Nakatani et al. | |
| 5,592,173 A | 1/1997 | Lau et al. | |
| 5,682,093 A | 10/1997 | Kivela | |
| 5,717,319 A | 2/1998 | Jokinen | |
| 5,719,800 A | 2/1998 | Mittal et al. | |

(Continued)

FOREIGN PATENT DOCUMENTS

EP 0381021 8/1990

(Continued)

OTHER PUBLICATIONS

"High-Speed, Digitally Adjusted Stepdown Controllers for Notebook CPUS", Maxim Manual, Jul. 2000, pp. 1-28.

(Continued)

*Primary Examiner* — Evan Pert (57) ABSTRACT

An integrated circuit with body-bias inputs coordinated by a switch at initial power application. A switch coupled to the N-well bias and P-type substrate bias lines of an integrated circuit selectively couples the substrate to ground or the substrate bias supply, depending upon the state of the bias supply lines. During power-up and the initial application of the N-well bias, the substrate is coupled to ground to prevent a leakage induce rise in the substrate potential. Upon sensing the presence of the substrate bias potential on the substrate bias line, the switch couples the substrate to the substrate bias line instead of ground. In another embodiment, a switch indirectly senses the availability of the substrate bias potential by sensing a charge pump enable signal.

22 Claims, 5 Drawing Sheets

U.S. PATENT DOCUMENTS

| | | | |
|---|---|---|---|
| 5,727,208 A | 3/1998 | Brown | |
| 5,745,375 A | 4/1998 | Reinhardt et al. | |
| 5,752,011 A | 5/1998 | Thomas et al. | |
| 5,754,869 A | 5/1998 | Holzhammer et al. | |
| 5,757,171 A | 5/1998 | Babcock | |
| 5,778,237 A | 7/1998 | Yamamoto et al. | |
| 5,812,860 A | 9/1998 | Horden et al. | |
| 5,815,724 A | 9/1998 | Mates | |
| 5,825,674 A | 10/1998 | Jackson | |
| 5,848,281 A | 12/1998 | Smalley et al. | |
| 5,884,049 A | 3/1999 | Atkinson | |
| 5,894,577 A | 4/1999 | MacDonald et al. | |
| 5,923,545 A | 7/1999 | Nguyen | |
| 5,933,649 A | 8/1999 | Lim et al. | |
| 5,940,785 A | 8/1999 | Georgiou et al. | |
| 5,940,786 A | 8/1999 | Steeby | |
| 5,942,932 A * | 8/1999 | Shen | 327/530 |
| 5,974,557 A | 10/1999 | Thomas et al. | |
| 5,996,083 A | 11/1999 | Gupta et al. | |
| 5,996,084 A | 11/1999 | Watts | |
| 6,035,407 A | 3/2000 | Gebara et al. | |
| 6,047,248 A | 4/2000 | Georgiou et al. | |
| 6,048,319 A | 4/2000 | Hudgins et al. | |
| 6,048,746 A | 4/2000 | Burr | |
| 6,087,892 A | 7/2000 | Burr | |
| 6,091,283 A | 7/2000 | Murgula et al. | |
| 6,118,306 A | 9/2000 | Orton et al. | |
| 6,119,241 A | 9/2000 | Michail et al. | |
| 6,157,092 A | 12/2000 | Hofmann | |
| 6,202,104 B1 | 3/2001 | Ober | |
| 6,216,235 B1 | 4/2001 | Thomas et al. | |
| 6,218,708 B1 | 4/2001 | Burr | |
| 6,272,642 B2 | 8/2001 | Pole, II et al. | |
| 6,279,048 B1 | 8/2001 | Fadavi-Ardekani et al. | |
| 6,304,824 B1 | 10/2001 | Bausch et al. | |
| 6,311,287 B1 | 10/2001 | Dischler et al. | |
| 6,314,522 B1 | 11/2001 | Chu et al. | |
| 6,345,363 B1 | 2/2002 | Levy-Kendler | |
| 6,347,379 B1 | 2/2002 | Dai et al. | |
| 6,378,081 B1 | 4/2002 | Hammond | |
| 6,388,432 B2 | 5/2002 | Uchida | |
| 6,415,388 B1 | 7/2002 | Browning et al. | |
| 6,427,211 B2 | 7/2002 | Watts, Jr. | |
| 6,442,746 B1 | 8/2002 | James et al. | |
| 6,457,135 B1 | 9/2002 | Cooper | |
| 6,466,077 B1 | 10/2002 | Miyazaki et al. | |
| 6,477,654 B1 | 11/2002 | Dean et al. | |
| 6,487,668 B2 | 11/2002 | Thomas et al. | |
| 6,489,224 B1 | 12/2002 | Burr | |
| 6,510,400 B1 | 1/2003 | Moriyama | |
| 6,510,525 B1 | 1/2003 | Nookala et al. | |
| 6,513,124 B1 | 1/2003 | Furuichi et al. | |
| 6,519,706 B1 | 2/2003 | Ogoro | |
| 6,574,739 B1 | 6/2003 | Kung et al. | |
| 6,600,346 B1 | 7/2003 | Macaluso | |
| 6,784,722 B2 | 8/2004 | Tang et al. | |
| 6,791,146 B2 | 9/2004 | Lai et al. | |
| 6,792,379 B2 | 9/2004 | Ando | |
| 6,803,633 B2 | 10/2004 | Mergens et al. | |
| 6,956,771 B2 * | 10/2005 | Sarig et al. | 365/185.18 |
| 6,992,508 B2 | 1/2006 | Chow | |
| 7,642,835 B1 * | 1/2010 | Fu et al. | 327/534 |
| 2002/0026597 A1 | 2/2002 | Dai et al. | |
| 2002/0073348 A1 | 6/2002 | Tani | |
| 2002/0083356 A1 | 6/2002 | Dai | |
| 2002/0087896 A1 | 7/2002 | Cline et al. | |
| 2002/0113628 A1 | 8/2002 | Ajit | |
| 2002/0116650 A1 | 8/2002 | Halepete et al. | |
| 2002/0138778 A1 | 9/2002 | Cole et al. | |
| 2002/0140494 A1 | 10/2002 | Thomas et al. | |
| 2002/0186071 A1 * | 12/2002 | Miyazaki et al. | 327/534 |
| 2002/0194509 A1 | 12/2002 | Plante et al. | |
| 2003/0014998 A1 | 1/2003 | Cabo | |
| 2003/0036876 A1 | 2/2003 | Fuller, III et al. | |
| 2003/0037008 A1 | 2/2003 | Raju et al. | |
| 2003/0065960 A1 | 4/2003 | Rusu et al. | |
| 2003/0074591 A1 | 4/2003 | McClendon et al. | |
| 2004/0025061 A1 | 2/2004 | Lawrence | |
| 2004/0073821 A1 | 4/2004 | Naveh et al. | |
| 2005/0160465 A1 | 7/2005 | Walker | |
| 2010/0073076 A1 * | 3/2010 | Fu et al. | 327/534 |

FOREIGN PATENT DOCUMENTS

| | | |
|---|---|---|
| EP | 0474963 | 3/1992 |
| EP | 0501655 | 9/1992 |
| JP | 409185589 | 7/1997 |
| WO | 0127728 | 4/2001 |

OTHER PUBLICATIONS

"Wafer Burn-In Isolation Circuit"; IBM Technical Disclosure Bulletin; IBM Corp. New York, US, vol. 32, No. 6B, Nov. 1, 1989, pp. 442-443.

Baker, K., et al.; "Shmoo Plotting: The Black Art of IC Testing"; IEEE Design & Test of Computers, IEEE vol. 14, No. 3; Jul. 1, 1997, pp. 90-97.

Computer Software, Wikipedia; "http://en.wikipedia.org/wiki/Software"; retrieved on May 2, 2007.

Desai, et al.; "Sizing of Clock Distribution Networks for High Performance CPU Chips"; Digital Equipment Corporation, Hudson, MA, Jun. 1996, pp. 389-394.

"LTC 1736 Product", Linear Technology Manual, Jan. 1999, pp. 1-28.

Movielink, LLC, Movielink Website, various webpages, http://www.movielink.com/, accessed Jan. 19, 2006, pp. 1-413.

Apple Computer, Inc., Apple QuickTime, various webpages, http://www.apple.com/quicktime/, accessed Jan. 19, 2006, pp. 1-115.

Apple Computer, Inc., QuickTime 7 Technology Brief, Nov. 2005, pp. 1-10.

Apple Computer, Inc., QuickTime 7 User's Guide, Nov. 16, 2005, pp. 1-61.

Apple Computer, Inc., QuickTime Guide for Windows, Jan. 10, 2006, pp. 1-44.

Final OA Dated Sep. 3, 2009; U.S. Appl. No. 11/241,552.

Non Final OA Dated Feb. 25, 2008; U.S. Appl. No. 11/241,552.

Non Final OA Dated Aug. 21, 2007; U.S. Appl. No. 11/241,552.

Non Final OA Dated Oct. 3, 2008; U.S. Appl. No. 11/241,552.

Hsu, J., "Fabrication of Single Walled Carbon Nanotube (SW-CNT) Cantilevers for Chemical Sensing", Master of Science Thesis, Louisiana State University, Dec. 2007, pp. 1-10.

Merrian-Webster's Collegiate Dictionary, Tenth Edition, 1998, Merrian-Webster Inc., pp. 252 and 603.

* cited by examiner

SYSTEM FOR SUBSTRATE POTENTIAL REGULATION DURING POWER-UP IN INTEGRATED CIRCUITS

CROSS REFERENCE TO RELATED APPLICATION

This patent application is a Divisional of U.S. patent application Ser. No. 10/712,523, filed on Nov. 12, 2003, entitled "SYSTEM FOR SUBSTRATE POTENTIAL REGULATION DURING POWER-UP IN INTEGRATED CIRCUITS", by Fu et al., which now U.S. Pat. No. 7,642,835, is incorporated herein by reference.

FIELD OF THE INVENTION

Embodiments of the present invention relate to circuits for providing operational voltages in complementary metal-oxide semiconductor (CMOS) circuits. In particular, embodiments of the present invention relate to a charge pump circuit with a variable output.

BACKGROUND ART

As the operating voltages for CMOS transistor circuits have decreased, variations in the threshold voltages for the transistors have become more significant. Although low operating voltages offer the potential for reduced power consumption, threshold voltage variations due to process and environmental variables often prevent optimum efficiency and performance from being achieved due to increased leakage currents.

Figure 1:
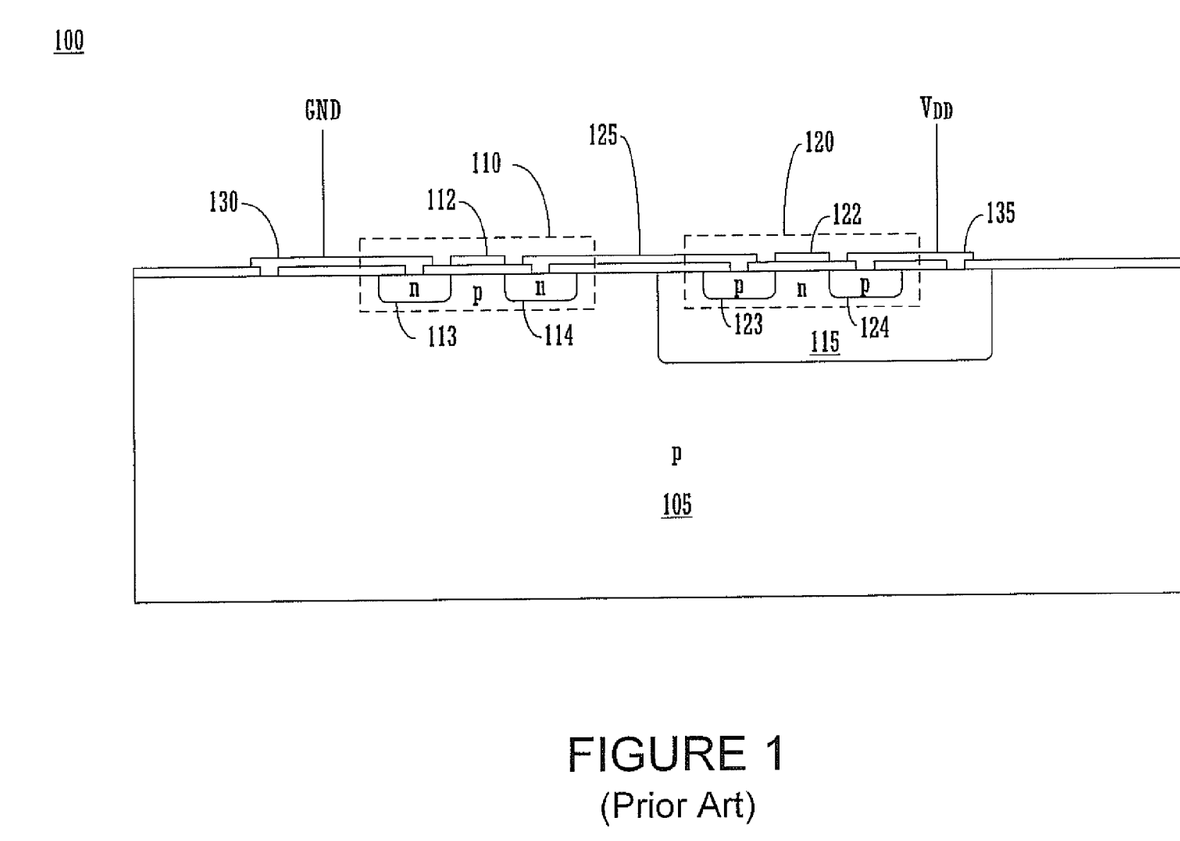
FIG. 1 shows a conventional CMOS inverter without body-bias connections.

Prior Art FIG. 1 shows a conventional CMOS inverter 100. A P-type substrate 105 supports an NFET 110 and a PFET 120. The NFET 110 comprises a gate 112, source 113, and drain 114. The PFET 120 resides in an n-well 115, and comprises a gate 122, drain 123, and a source 124. The substrate 105 and source 113 are coupled by a tie 130 that is connected to ground (GND), while source 124 and N-well 115 are coupled by a tie 135 that is connected to a supply voltage ($V_{DD}$). The input to the inverter is applied to the gates 112 and 122, with the output taken from the drain contact 125. In this conventional configuration, the transistors are often treated as three terminal devices.

Threshold voltage variations may be compensated for by body-biasing. Body-biasing introduces a reverse bias potential between the bulk and the source of the transistor that allows the threshold voltage of the transistor to be adjusted electrically. The purpose of body-biasing is to compensate for 1) process variations; 2) temperature variations; 3) supply voltage variations; 4) changes in frequency of operation; and 5) changing levels of switching activity.

Figure 2:
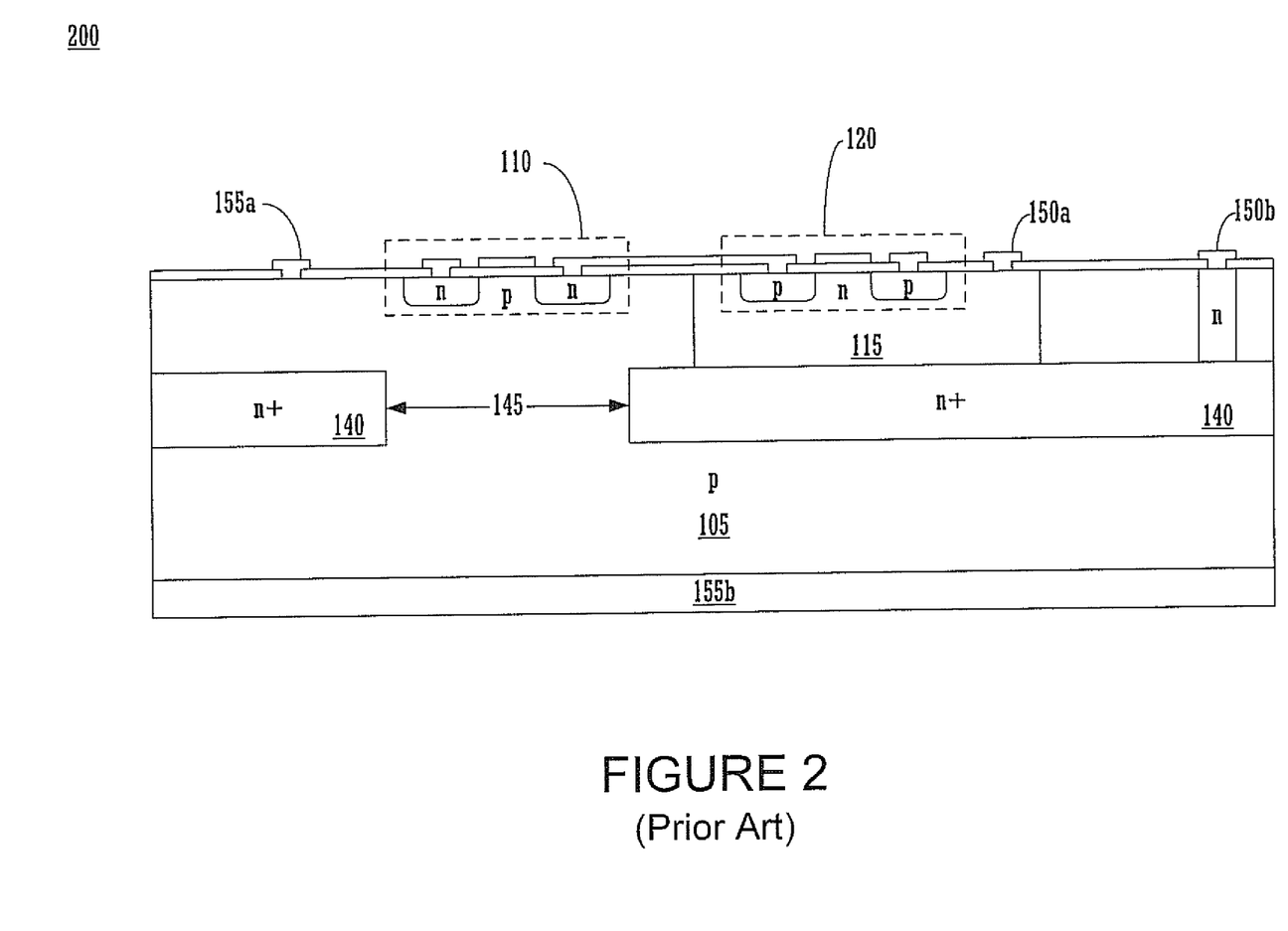
FIG. 2 shows a conventional CMOS inverter with body-bias connections.

Prior Art FIG. 2 shows an inverter having connections for body-biasing. Body-bias can provided to the PFET 120 through a direct bias contact 150$a$, or by a buried n-well 140 using contact 150$b$. Similarly, body-bias may be provided to the NFET 110 by a surface contact 155$a$, or by a backside contact 155$b$. An aperture 145 may be provided in the buried n-well 125 so that the bias potential reaches the NFET 110. In general, a PFET 120 or an NFET 110 may be biased by one of the alternative contacts shown.

In integrated circuits that employ body-biasing, the transistors are effectively four terminal devices, and the substrate potential is not be maintained at ground. When the substrate bias supply (e.g., $V_{BBP}$) is off the substrate potential may float.

A floating substrate potential can be a problem during the initial application of power to an integrated circuit. When a body-bias (e.g., $V_{BBN}$) is initially applied to an N-well, leakage to the substrate from that N-well may cause the substrate potential to rise. This rise in substrate potential can forward bias the junction between the substrate and N-wells that are not connected to $V_{BBN}$, causing undesired current flow.

SUMMARY OF INVENTION

Thus, a need exists for a system for preventing undesired current flow during power-up in integrated circuits that employ body-biasing.

Accordingly, embodiments of the present invention provide a switch or clamp that responds to conditions at power-up and prevents a circuit substrate from floating.

In one embodiment of the present invention, a bias input ($V_{BBN}$) to an N-well is coupled to a control input for a single-pole, double-throw switch that couples an integrated circuit substrate to ground or to a bias voltage supply ($V_{BBP}$) When $V_{BBN}$ is on and $V_{BBP}$ is off, the switch couples the substrate to ground. When $V_{BBP}$ is on, the switch couples the substrate to $V_{BBP}$.

In another embodiment of the present invention, a bias input ($V_{BBN}$) to an N-well is coupled to a control input for a single-pole, double-throw switch. The switch also has a control input coupled to a charge pump enable signal line ($CP_{ENABLE}$). When $V_{BBN}$ is high and $CP_{ENABLE}$ is low, the switch couples the substrate to ground. $CP_{ENABLE}$ is high, the switch is open.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

DESCRIPTION OF THE PREFERRED EMBODIMENTS

In the following detailed description of the present invention, a variable output charge pump circuit, numerous specific details are set forth in order to provide a thorough understanding of the present invention. However, it will be obvious to one skilled in the art that the present invention may be practiced without these specific details. In other instances well known methods, procedures, components, and circuit elements have not been described in detail as not to unnecessarily obscure aspects of the present invention.

Figure 3:
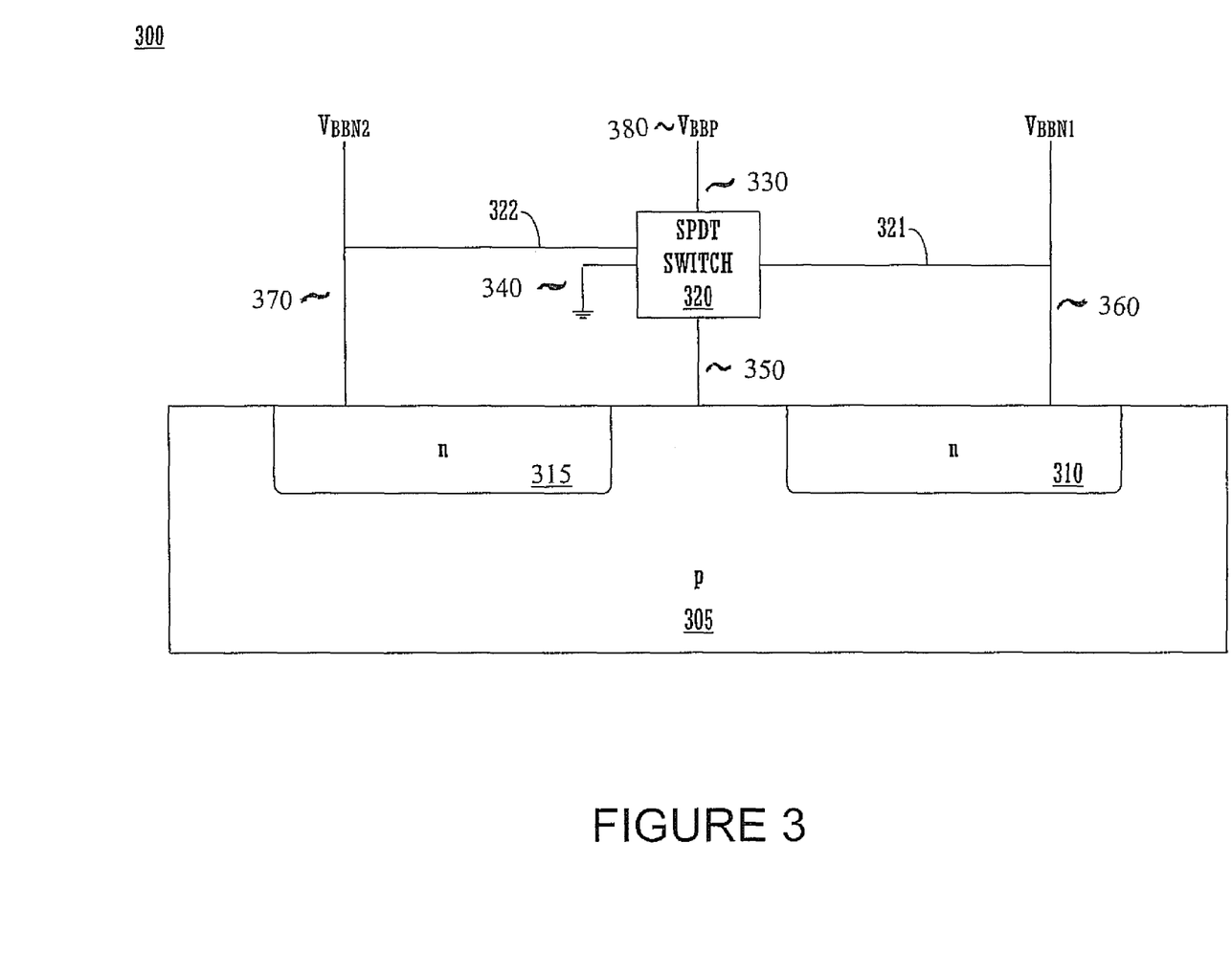
FIG. 3 shows a diagram of a portion of an integrated circuit with body-bias inputs coordinated by a single-pole, double throw (SPDT) switch, in accordance with an embodiment of the present claimed invention.

FIG. 3 shows a diagram 300 of a portion of an integrated circuit with a P-type substrate 305 having a first N-well 310 and a second N-well 315. Body-bias $V_{BBN1}$ 360 is provided to N-well 310 and body-bias $V_{BBN2}$ 370 is provided to N-well 315. Body-bias $V_{BBN1}$ 360 is coupled to switch 320 as a control input 321, and body-bias $V_{BBN2}$ 370 is optionally coupled to switch 320 as a control input 322. The switch 320 has a switched terminal 330 coupled to $V_{BBP}$ 380 and a switched terminal 340 coupled to ground. The switch has a fixed output terminal 350 coupled to the substrate 305. As used herein, the term "coupled" refers to a physical coupling and does not necessarily imply an electrical coupling. Electrical coupling may be made selectively between elements that are physically coupled.

Switch 320 acts as a single-pole, double-throw (SPDT) switch, selectively and electrically coupling the substrate 305 to body bias $V_{BBP}$ 380 or ground, depending upon the state of bias supply lines $V_{BBN2}$ 360, $V_{BBN2}$ 370, and $V_{BBP}$ 380. If $V_{BBN2}$ 360 (or $V_{BBN2}$ 370 if present) is high and $V_{BBP}$ 380 is off, the switch 320 electrically couples the substrate 305 to ground. By electrically coupling the substrate to ground, the switch prevents the substrate from floating up to a potential that could forward bias the junction between the substrate and an unbiased N-well in the integrated circuit.

Operating power is supplied to the switch 320 by a small auxiliary charge pump (not shown) rather than one of the bias lines, since it is desirable that the switch be able to operate regardless of the state of the bias lines.

If $V_{BBP}$ 380 is on (e.g., −1.2 volts) and $V_{BBN2}$ 360 (or $V_{BBN2}$ 370 if present) is high, the switch 320 couples the substrate to $V_{BBP}$ 380. For the case when $V_{BBP}$ 380 is on while $V_{BBN1}$ 360 and $V_{BBN2}$ 370 are low, the switch may be built to switch the substrate to either $V_{BBP}$ 380 or to ground, depending upon other design considerations. For all possible bias input combinations, the switch 320 provides a regulated substrate potential that prevents undesirable forward biasing of the substrate/N-well junction.

For all possible bias input combinations, the switch 320 provides a regulated substrate potential that prevents undesirable forward biasing of the substrate/N-well junction. The switch operates to electrically couple the substrate to a substrate bias voltage or to ground, in response to particular combinations of bias voltages on the N-well and substrate bias lines.

Figure 4:
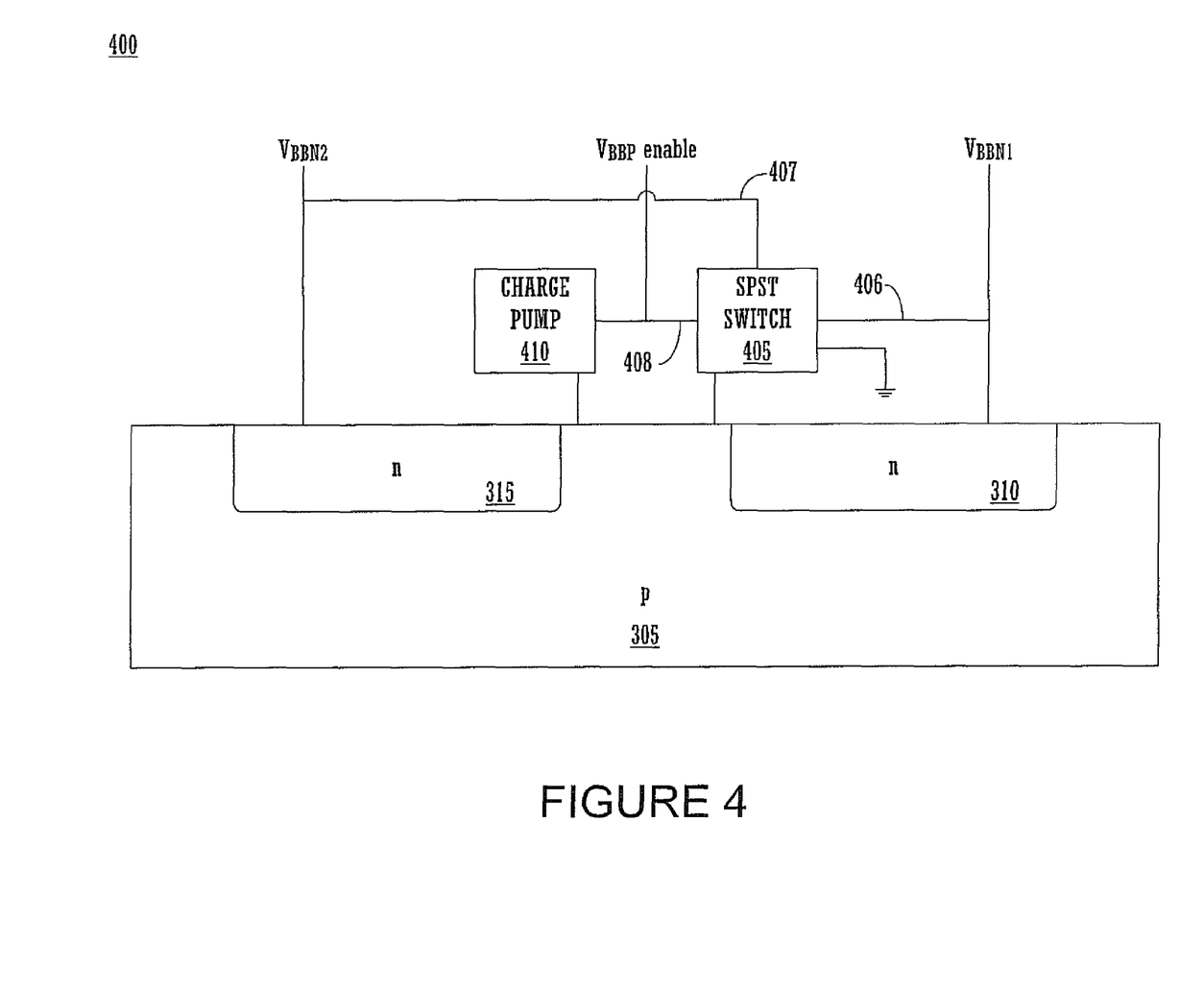
FIG. 4 shows a diagram of a portion of an integrated circuit with body-bias inputs coordinated by a single-pole, single-throw (SPST) switch, in accordance with an embodiment of the present claimed invention.

FIG. 4 shows a diagram 400 of a portion of an integrated circuit with a P-type substrate 305 having a first N-well 310 and a second N-well 315. Body-bias $V_{BBN1}$ is provided to N-well 310 and body-bias $V_{BBN2}$ is provided to N-well 315. Body-bias $V_{BBN1}$ is coupled to switch 405 as a control input 406, and body-bias $V_{BBN2}$ is optionally coupled to switch 405 as a control input 407.

A charge pump 410 having a $V_{BBP}$ enable input is coupled to substrate 305. The $V_{BBP}$ enable input is also coupled to the switch 405 as a control input 408. The charge pump 410 provides the bias potential $V_{BBP}$ for the substrate 305.

Switch 405 acts as a single-pole, double-throw (SPDT) switch, coupling the substrate 305 to ground, depending upon the state of $V_{BBN1}$, $V_{BBN2}$, and $V_{BBP}$ enable. If $V_{BBN1}$ (or $V_{BBN2}$ if present) is high and $V_{BBP}$ enable is low, the switch 405 couples the substrate 305 to ground. By clamping the substrate to ground, the switch prevents the substrate from floating up to a potential that could forward bias the junction between the substrate and an unbiased N-well in the integrated circuit.

If $V_{BBP}$ enable is high and $V_{BBN1}$ (or $V_{BBN2}$ if present) is high, the switch 405 isolates the substrate from ground. It is desirable that the switch 405 be sufficiently fast to isolate the substrate before the charge pump output reaches a significant value. In general, a charge pump turn-on will be slower than that of the switch 405.

Figure 5:
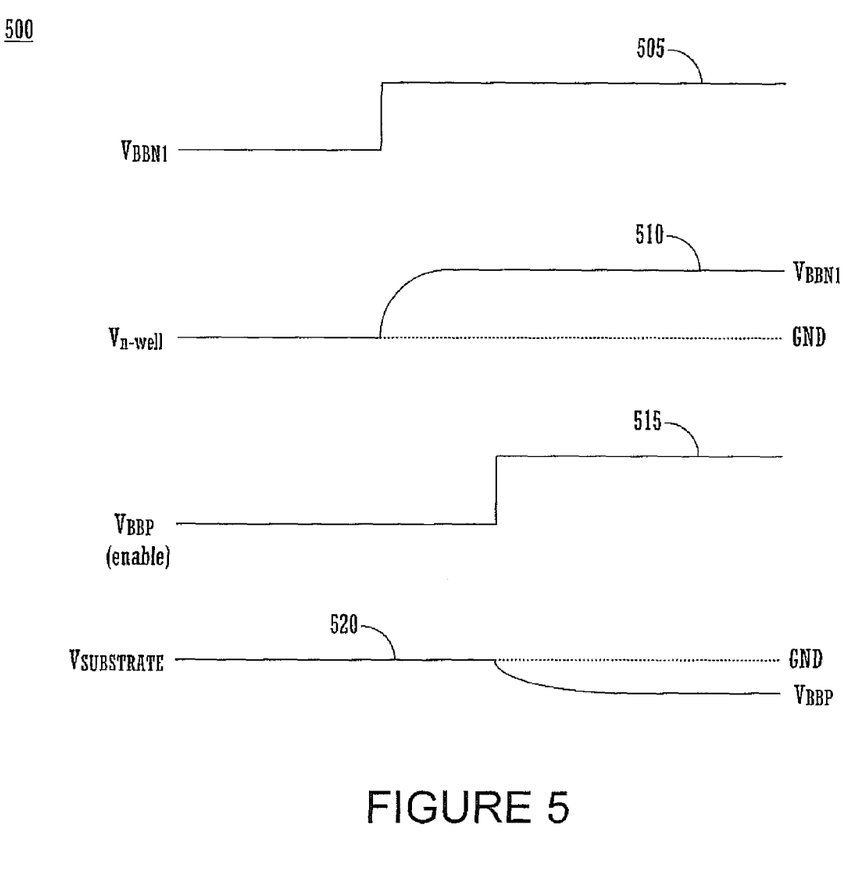
FIG. 5 shows a timing diagram for the body-bias potentials on power-up, in accordance with an embodiment of the present claimed invention.

FIG. 5 shows a representative timing diagram 500 for the body-bias, N-well, and substrate potentials on power-up, in accordance with an embodiment of the present invention. Trace 505 shows the turn-on or enablement of the N-well bias supply $V_{BBN1}$. The sharp edge is idealized, and corresponds to a logic signal initiating the application of $V_{BBN1}$.

Trace 510 shows the voltage of the N-well rising from ground (GND) to $V_{BBN1}$ over time as the capacitance associated junction between the substrate and well is charged. Since bias supplies typically have a low current demand under steady state conditions, the initial rise time is slower than that of trace 505 due to the limited current.

Trace 515 shows the turn-on or enablement of the P-type substrate bias supply $V_{BBP}$. The sharp edge is idealized, and corresponds to a logic signal initiating the application of $V_{BBP}$ (e.g., the signal $V_{BBP}$ enable of FIG. 4). Trace 510 shows the voltage of the P-type substrate dropping from ground (GND) to $V_{BBP}$ over time as the capacitance associated junction between the substrate and well is discharged. Since bias supplies typically have a low current demand under steady state conditions, the initial rise time is slower than that of trace 515 due to the limited current.

As shown by trace 520, the action of the substrate regulating switch of the present invention prevents the substrate potential from rising above ground. The substrate potential is maintained between ground and $V_{BBP}$.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, an integrated circuit having a P-type substrate and an N-well disposed therein is described. More generally, the invention may be used with a semiconductor substrate of either N-type or P-type having a complementary well disposed therein. The embodiments were chosen and described in order to best explain the principles of the invention and its practical application, to thereby enable others skilled in the art to best utilize the invention and various embodiments with various modifications and are suited to the particular use contemplated. It is intended that the scope of the invention be defined by the claims appended hereto and their equivalents.

What is claimed is:

1. A circuit for regulating a substrate potential of an integrated circuit comprising:
    a circuit element including:
        a first input coupled to a first bias potential;
        a second input coupled to a second bias potential;
        a third input coupled to a charge pump enable line; and
        an output terminal coupled to a substrate of said integrated circuit.

2. The circuit of claim 1, wherein said circuit element is operable to electrically couple said substrate to said second bias potential when said first bias potential is on and said charge pump enable line is off.

3. The circuit of claim 1, wherein said circuit element is operable to isolate said substrate from said second bias potential when said first bias potential is on and said charge pump enable line is on.

4. The circuit of claim 1, wherein said circuit element further comprises a fourth input coupled to a third bias potential.

5. The circuit of claim 4, wherein said circuit element is operable to electrically couple said substrate to said second bias potential when said third bias potential is on and said charge pump enable line is off.

6. The circuit of claim 4, wherein said circuit element is operable to electrically isolate said substrate from said second bias potential when said third bias potential is on and said charge pump enable line is on.

7. The circuit of claim 4, wherein said first bias potential comprises a first well bias.

8. The circuit of claim 4, wherein said second bias potential comprises a ground.

9. The circuit of claim 4, wherein said third bias potential comprises a second well bias.

10. The circuit of claim 1, wherein said circuit element comprises a switch.

11. An integrated circuit comprising:
a substrate;
a first well disposed in said substrate; and
a circuit element including:
   a first input coupled to a first bias potential and to said first well;
   a second input coupled to a second bias potential;
   a third input coupled to a charge pump enable line; and
   an output terminal coupled to said substrate.

12. The integrated circuit of claim 11, wherein said circuit element is operable to electrically couple said substrate to said second bias potential when said first bias potential is on and said charge pump enable line is off.

13. The integrated circuit of claim 11, wherein said circuit element is operable to isolate said substrate from said second bias potential when said first bias potential is on and said charge pump enable line is on.

14. The integrated circuit of claim 11, wherein said circuit element comprises a switch.

15. The integrated circuit of claim 14, wherein said switch is a single-pole, double throw (SPDT) switch.

16. The integrated circuit of claim 11, further comprising:
a second well disposed in said substrate.

17. The integrated circuit of claim 16, wherein said circuit element further comprises a fourth input coupled to a third bias potential and said second well.

18. The integrated circuit of claim 17, wherein said circuit element is operable to electrically couple said substrate to said second bias potential when said third bias potential is on and said charge pump enable line is off.

19. The integrated circuit of claim 17, wherein said circuit element is operable to electrically isolate said substrate from said second bias potential when said third bias potential is on and said charge pump enable line is on.

20. The integrated circuit of claim 17, wherein said first bias potential comprises a first well bias.

21. The integrated circuit of claim 17, wherein said second bias potential comprises a ground.

22. The integrated circuit of claim 17, wherein said third bias potential comprises a second well bias.

* * * * *

UNITED STATES PATENT AND TRADEMARK OFFICE
CERTIFICATE OF CORRECTION

PATENT NO.        : 8,022,747 B2                          Page 1 of 1
APPLICATION NO.   : 12/628010
DATED             : September 20, 2011
INVENTOR(S)       : Fu et al.

It is certified that error appears in the above-identified patent and that said Letters Patent is hereby corrected as shown below:

Title Page 2, item (56), under "Other Publications", in Column 2, Lines 31-32, delete "Merrian-Webster's Collegiate Dictionary, Tenth Edition, 1998, Merrian-Webster Inc.," and insert -- Merriam-Webster's Collegiate Dictionary, Tenth Edition, 1998, Merriam-Webster Inc., --.

Column 1, line 12, delete "which now U.S. Pat. No. 7,642,835, is" and insert -- now U.S. Pat. No. 7,642,835, which is --.

Signed and Sealed this
Sixth Day of March, 2012

David J. Kappos
*Director of the United States Patent and Trademark Office*